US012627908B2

(12) United States Patent
Shiraishi

(10) Patent No.: US 12,627,908 B2
(45) Date of Patent: May 12, 2026

(54) ELECTRONIC DEVICE, ELECTRONIC SYSTEM INCLUDING THE SAME AND OPERATING METHOD OF THE ELECTRONIC SYSTEM

(71) Applicant: SK hynix Inc., Gyeonggi-do (KR)

(72) Inventor: Daisuke Shiraishi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 352 days.

(21) Appl. No.: 18/348,353

(22) Filed: Jul. 7, 2023

(65) Prior Publication Data

US 2024/0284073 A1      Aug. 22, 2024

(30) Foreign Application Priority Data

Feb. 16, 2023    (KR) ........................ 10-2023-0020743

(51) Int. Cl.
| | |
|---|---|
| *H04N 25/76* | (2023.01) |
| *H03K 5/22* | (2006.01) |
| *H03K 21/02* | (2006.01) |
| *H04N 23/661* | (2023.01) |

(52) U.S. Cl.
CPC .......... *H04N 25/7795* (2023.01); *H03K 5/22* (2013.01); *H03K 21/02* (2013.01); *H04N 23/662* (2023.01)

(58) Field of Classification Search
CPC ............. H04N 25/7795; H04N 23/662; H04N 25/745; H04N 25/75; H04N 25/773; H04N 5/06; H04N 25/77; H03K 5/22; H03K 21/02; H04W 56/00
See application file for complete search history.

(56) References Cited

U.S. PATENT DOCUMENTS

| | | | |
|---|---|---|---|
| 10,616,484 B2 | 4/2020 | Cohen et al. | |
| 2016/0142592 A1* | 5/2016 | Muraki .................. | H04N 25/70 |
| | | | 348/513 |
| 2019/0116351 A1* | 4/2019 | Hewes ................. | H04N 13/296 |
| 2021/0274064 A1* | 9/2021 | Bangs .................... | H04N 23/66 |
| 2025/0220300 A1* | 7/2025 | Tong ..................... | H04N 23/71 |

OTHER PUBLICATIONS

Sameer Ansari et al., Wireless Software Synchronization of Multiple Distributed Cameras, Jun. 11, 2019, Google Research, Mountain View, CA, USA.

* cited by examiner

*Primary Examiner* — Nhan T Tran
(74) *Attorney, Agent, or Firm* — IP & T GROUP LLP

(57) ABSTRACT

Disclosed is an electronic device including a counter suitable for counting a clock signal and generating a count signal corresponding to a count value of the clock signal, a target count generator suitable for generating a target count signal based on the count signal and a second adjusting signal, a comparator suitable for comparing the target count signal with a reference count signal and generating a comparison signal which corresponds to a difference value between the count value corresponding to the target count signal and a count value corresponding to the reference count signal, and a count value adjuster suitable for generating the second adjusting signal corresponding to the difference value, based on the comparison signal.

19 Claims, 15 Drawing Sheets

150

<u>130</u>

230

ELECTRONIC DEVICE, ELECTRONIC SYSTEM INCLUDING THE SAME AND OPERATING METHOD OF THE ELECTRONIC SYSTEM

CROSS-REFERENCE TO RELATED APPLICATION(S)

This application claims priority under 35 U.S.C. § 119 to Korean Patent Application No. 10-2023-0020743, filed on Feb. 16, 2023, the disclosure of which is incorporated herein by reference in its entirety.

BACKGROUND

1. Field

Various embodiments of the present disclosure relate to a semiconductor design technique, and more particularly, to an electronic device including an image sensor, an electronic system including the electronic device, and an operating method of the electronic system.

2. Description of the Related Art

Image sensors are devices for capturing images using the property of a semiconductor which reacts to light. Image sensors may be roughly classified into charge-coupled device (CCD) image sensors and complementary metal-oxide semiconductor (CMOS) image sensors. Recently, CMOS image sensors are widely used because the CMOS image sensors can allow both analog and digital control circuits to be directly implemented on a single integrated circuit (IC).

SUMMARY

Various embodiments of the present disclosure are directed to an electronic device capable of synchronizing image frames when recording a video, an electronic system including the electronic device, and an operating method of the electronic system.

In accordance with an embodiment of the present disclosure, an electronic device may include: a counter suitable for counting a clock signal and generating a count signal corresponding to a count value of the clock signal; a target count generator suitable for generating a target count signal based on the count signal and a second adjusting signal; a comparator suitable for comparing the target count signal with a reference count signal and generating a comparison signal which corresponds to a difference value between the count value corresponding to the target count signal and a count value corresponding to the reference count signal; and a count value adjuster suitable for generating the second adjusting signal corresponding to the difference value, based on the comparison signal.

In accordance with an embodiment of the present disclosure, an electronic system may include: a first electronic device suitable for obtaining first image frames for each frame period, based on a first clock signal and generating a first count signal corresponding to the first clock signal; and a second electronic device suitable for obtaining second image frames for each frame period, based on a second clock signal, and adjusting a toggling number of the second clock signal for each frame period, based on the first count signal and the second clock signal.

In accordance with an embodiment of the present disclosure, an operating method of an electronic system may include: providing, by a first electronic device, a second electronic device with a first count signal generated by a first image sensor; comparing, by the second electronic device, the first count signal with a second count signal generated by a second image sensor; and adjusting, by the second image sensor, a second frame period of the second image sensor while maintaining, by the first image sensor, a first frame period when, as a result of the comparing, a first count value corresponding to the first count signal is different from a second count value corresponding to the second count signal.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
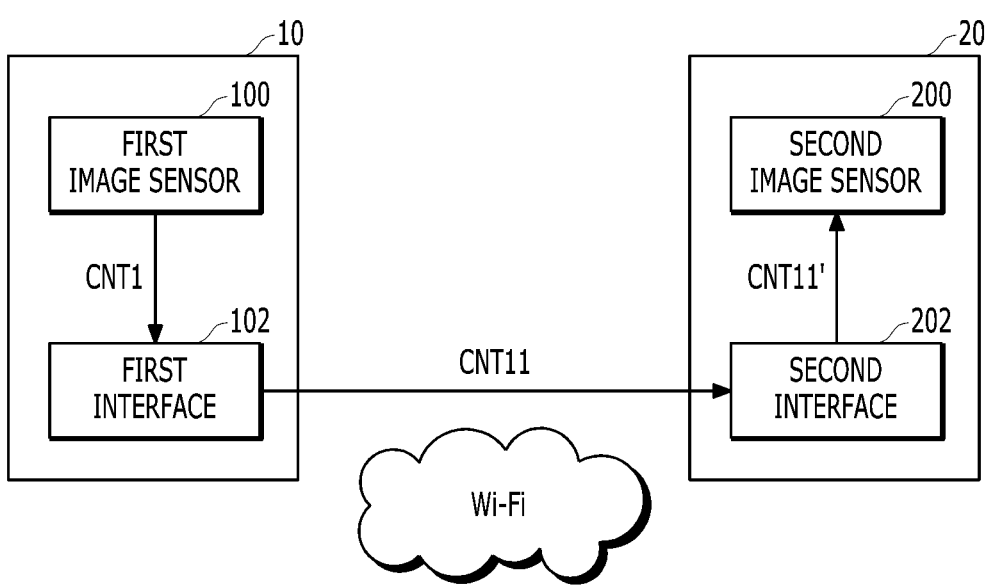
FIG. 1 is a block diagram illustrating an electronic system in accordance with an embodiment of the present disclosure.

FIG. 1 is a block diagram illustrating an electronic system in accordance with an embodiment of the present disclosure.

Referring to FIG. 1, the electronic system may include a first electronic device 10 and a second electronic device 20. In the present embodiment, it is described as an example that the first electronic device 10 is set as a master device, and the second electronic device 20 is set as a slave device. For example, each of the first and second electronic devices 10 and 20 may include a portable terminal such as a smart phone or tablet.

The first electronic device 10 may obtain, for each frame period, first image frames corresponding to captured scenes. The first electronic device 10 may obtain the first image frames based on a first clock signal CLK1 which is to be described later. The first electronic device 10 may generate a first count signal CNT11 corresponding to the first clock signal CLK1 and transmit the first count signal CNT11 to the second electronic device 20. For example, the first electronic device 10 may include a first image sensor 100 and a first interface 102.

The first image sensor 100 may obtain the first image frames based on the first clock signal CLK1. The first image sensor 100 may count, for each frame period, a toggling number of the first clock signal CLK1 (hereinafter referred to as a "first toggling number") and generate a first toggling count signal CNT1 representing the first toggling number.

The first interface 102 may receive the first toggling count signal CNT1. The first interface 102 may output the first count signal CNT11 corresponding to the first toggling count signal CNT1.

The second electronic device 20 may obtain, for each frame period, second image frames corresponding to captured scenes. The second electronic device 20 may obtain the second image frames based on a second clock signal CLK2 which is to be described later. The second electronic device 20 may synchronize the second image frames with the first image frames by adjusting, for each frame period, a toggling number of the second clock signal CLK2 (hereinafter referred to as a "second toggling number") based on the first count signal CNT11 and the second clock signal CLK2. For example, the second electronic device 20 may include a second image sensor 200 and a second interface 202.

The second image sensor 200 may obtain the second image frames based on the second clock signal CLK2. The second image sensor 200 may adjust, for each frame period, the second toggling number of the second clock signal CLK2 based on a first reference count signal CNT11' and the second clock signal CLK2.

The second interface 202 may receive the first count signal CNT11. The second interface 202 may output the first reference count signal CNT11' corresponding to the first count signal CNT11.

The first count signal CNT11 may be transmitted from the first electronic device 10 to the second electronic device 20 through a wireless communication network. For example, the wireless communication network may include a Wi-Fi network.

The first clock signal CLK1 and the second clock signal CLK2 may have the same cycle. Although the first clock signal CLK1 and the second clock signal CLK2 are generated to have the same cycle, a skew may occur between the first clock signal CLK1 and the second clock signal CLK2 depending on PVT (process, voltage, and temperature) variations. When the skew occurs between the first clock signal CLK1 and the second clock signal CLK2, the first image frames and the second image frames may not be synchronized. However, in the present embodiment, even though the skew occurs between the first clock signal CLK1 and the second clock signal CLK2, the second image frames may be synchronized with the first image frames.

Figure 2:
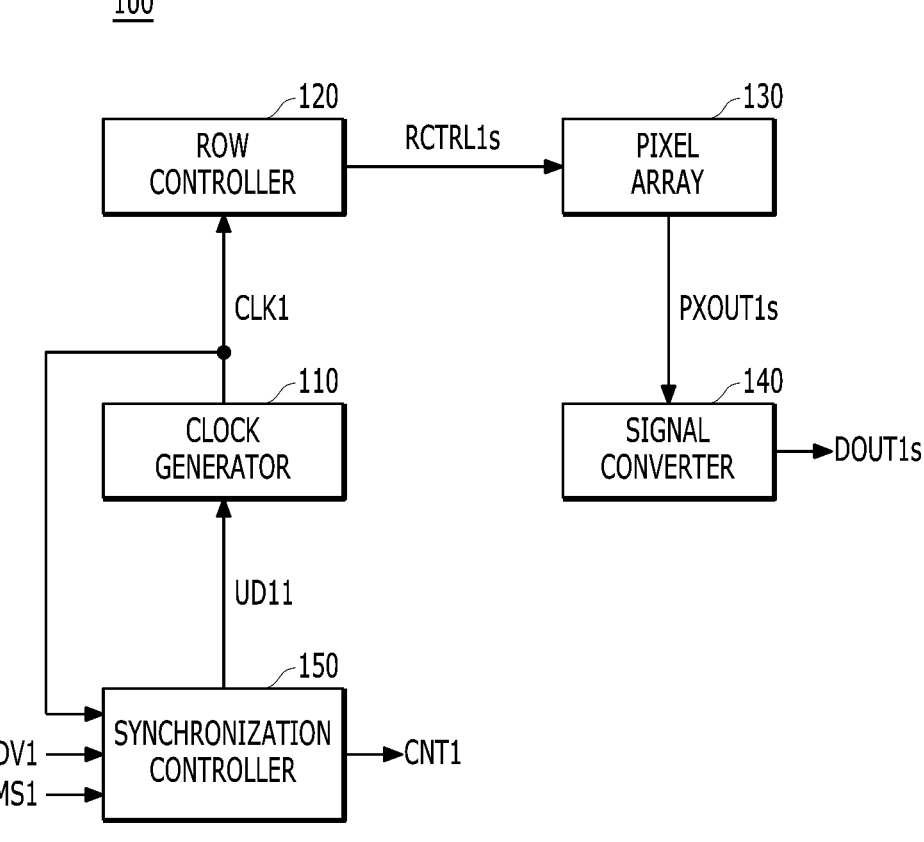
FIG. 2 is a block diagram illustrating a first image sensor illustrated in FIG. 1.

FIG. 2 is a block diagram illustrating the first image sensor 100 illustrated in FIG. 1.

Referring to FIG. 2, the first image sensor 100 may include a clock generator 110, a row-controller 120, a pixel array 130, a signal converter 140, and a synchronization controller 150.

The clock generator 110 may generate, based on a first adjusting signal UD11, the first clock signal CLK1 having the first toggling number for each frame period. For example, the clock generator 110 may generate the first clock signal CLK1 having the first toggling number, which is constant for each frame period.

The row-controller 120 may generate row-control signals RCTRL1s for each frame period based on the first clock signal CLK1. The row-controller 120 may control the pixel array 130 for each row. For example, the row-controller 120 may generate first row-control signals for controlling pixels arranged in a first row ROW1 of the pixel array 130 and generate $y^{th}$ row-control signals for controlling pixels arranged in an $y^{th}$ row ROWy of the pixel array 130. The first to $y^{th}$ row-control signals may be included in the row-control signals RCTRL1s.

The pixel array 130 may generate, based on the row-control signals RCTRL1s, pixel signals PXOUT1s corresponding to a first image frame for each frame period. The pixel array 130 may include pixels PXs arranged in a row direction and a column direction (refer to FIG. 3).

The signal converter 140 may convert the pixel signals PXOUT1s into digital signals DOUT1s. For example, the signal converter 140 may include an analog to digital converter (ADC).

The synchronization controller 150 may generate the first adjusting signal UD11 and the first toggling count signal CNT1 based on the first clock signal CLK1, a first identification signal MS1, and a first setting signal DV1.

Figure 3:
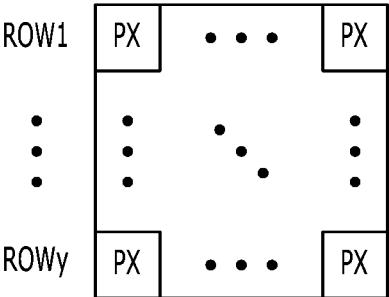
FIG. 3 is a block diagram illustrating a pixel array illustrated in FIG. 2.

FIG. 3 is a block diagram illustrating the pixel array 130 illustrated in FIG. 2.

Referring to FIG. 3, the pixel array 130 may include the pixels PXs arranged at intersections of a plurality of rows and a plurality of columns. The pixel array 130 may generate the pixel signals PXOUT1s for each row based on the row-control signals RCTRL1s. For example, the pixel array 130 may generate the pixel signals PXOUT1s from the pixels arranged in the first row ROW1, based on the first row-control signals during a first row-line period, and generate the pixel signals PXOUT1s from the pixels arranged in the $y^{th}$ row ROWy based on the $y^{th}$ row-control signals during an $y^{th}$ row-line period.

Figure 4:
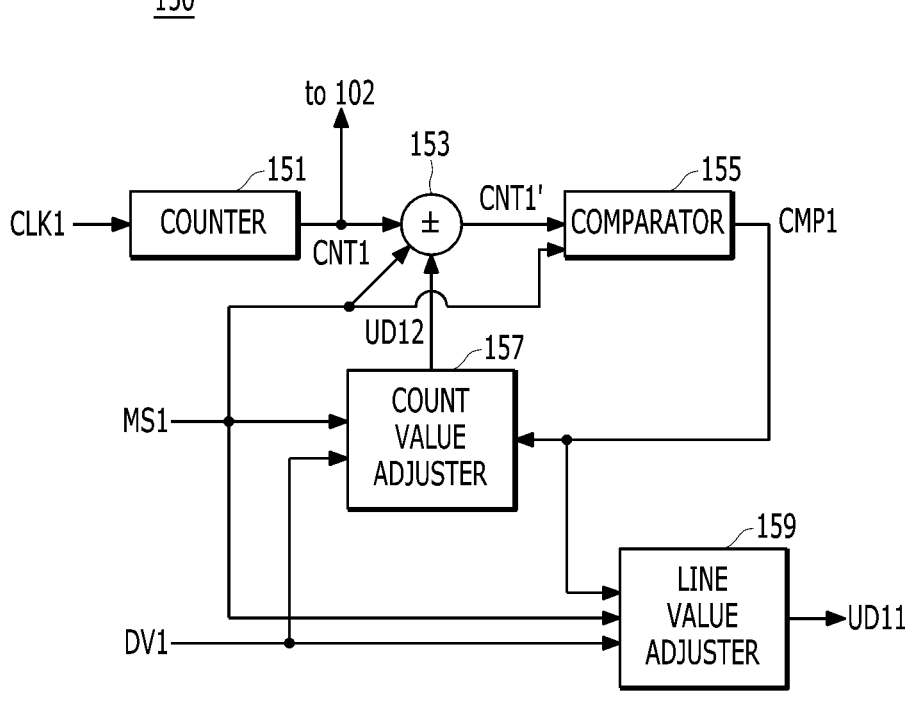
FIG. 4 is a block diagram illustrating a synchronization controller illustrated in FIG. 2.

FIG. 4 is a block diagram illustrating the synchronization controller 150 illustrated in FIG. 2.

Referring to FIG. 4, the synchronization controller 150 may include a counter 151, a target count generator 153, a comparator 155, a count value adjuster 157, and a line value adjuster 159.

The counter 151 may count the first toggling number of the first clock signal CLK1 for each frame period. The counter 151 may generate the first toggling count signal CNT1 corresponding to a count value of the first clock signal CLK1. When the count value reaches a maximum count value, for example, $2^n$, the counter 151 may perform a wrap-around operation of initializing the count value from the maximum count value to a minimum count value, for example, 1.

Each of the target count generator 153, the comparator 155, and the count value adjuster 157 may be disabled according to the first identification signal MS1. In the present embodiment, as the first electronic device 10 is set as the master device, the first identification signal MS1 may have a logic level indicating the master device. When the first electronic device 10 is set as the master device, each of the target count generator 153, the comparator 155, and the count value adjuster 157 may be designed to be disabled.

The line value adjuster 159 may generate, based on the first identification signal MS1 and the first setting signal DV1, the first adjusting signal UD11 corresponding to a first default value. For example, the line value adjuster 159 may generate, according to the first identification signal MS1, the first adjusting signal UD11, which is maintained or fixed to the first default value corresponding to the first setting signal DV1.

Figure 5:
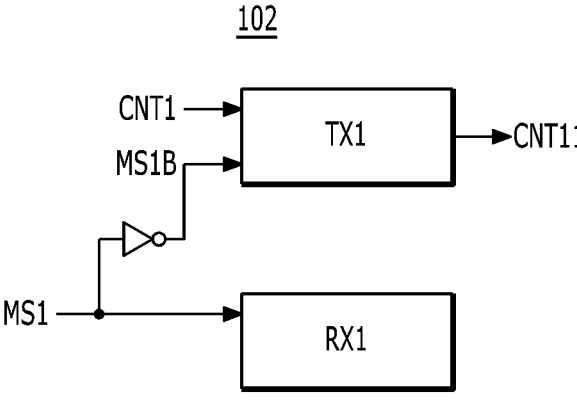
FIG. 5 is a block diagram illustrating a first interface illustrated in FIG. 1.

FIG. 5 is a block diagram illustrating the first interface 102 illustrated in FIG. 1.

Referring to FIG. 5, the first interface 102 may include a transmitter TX1 and a receiver RX1.

The transmitter TX1 may be enabled according to the first identification signal MS1. More precisely, the transmitter TX1 may be enabled according to an inverted signal MS1B of the first identification signal MS1. The transmitter TX1 may receive the first toggling count signal CNT1 and output the first count signal CNT11 corresponding to the first toggling count signal CNT1.

The receiver RX1 may be disabled according to the first identification signal MS1.

Figure 6:
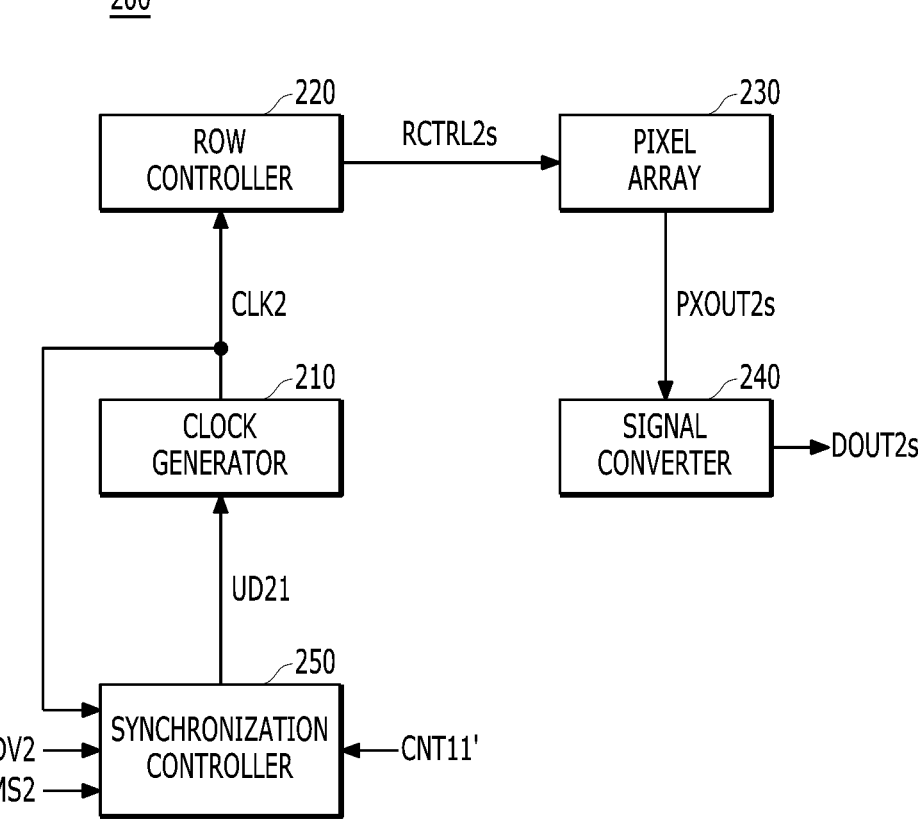
FIG. 6 is a block diagram illustrating a second image sensor illustrated in FIG. 1.

FIG. 6 is a block diagram illustrating the second image sensor 200 illustrated in FIG. 1.

Referring to FIG. 6, the second image sensor 200 may include a clock generator 210, a row-controller 220, a pixel array 230, a signal converter 240, and a synchronization controller 250.

The clock generator 210 may generate, based on a second adjusting signal UD21, the second clock signal CLK2 having the second toggling count for each frame period. When generating the second clock signal CLK2 for each frame period, the clock generator 210 may adjust, based on the second adjusting signal UD21, the second toggling number of the second clock signal CLK2. For example, the clock generator 210 may generate the second clock signal CLK2 having the second toggling number, which may vary for each frame period.

The row-controller 220 may generate row-control signals RCTRL2$s$ for each frame period based on the second clock signal CLK2. The row-controller 220 may control the pixel array 230 for each row. For example, the row-controller 220 may generate first row-control signals for controlling pixels arranged in a first row ROW1 of the pixel array 230, and generate $y^{th}$ row-control signals for controlling pixels arranged in an $y^{th}$ row ROWy of the pixel array 230. The first to $y^{th}$ row-control signals may be included in the row-control signals RCTRL2$s$.

The pixel array 230 may generate, based on the row-control signals RCTRL2$s$, pixel signals PXOUT2$s$ corresponding to a second image frame for each frame period. The pixel array 230 may include pixels PXs arranged in a row direction and a column direction (refer to FIG. 7).

The signal converter 240 may convert the pixel signals PXOUT2$s$ into digital signals DOUT2$s$. For example, the signal converter 240 may include an analog to digital converter (ADC).

The synchronization controller 250 may generate the second adjusting signal UD21 based on the first reference count signal CNT11', the second clock signal CLK2, a second identification signal MS2, and a second setting signal DV2.

Figure 7:
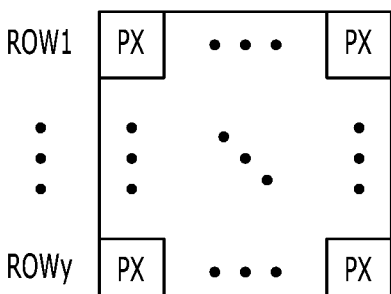
FIG. 7 is a block diagram illustrating a pixel array illustrated in FIG. 6.

FIG. 7 is a block diagram illustrating the pixel array 230 illustrated in FIG. 6.

Referring to FIG. 7, the pixel array 230 may include the pixels PXs arranged at intersections of a plurality of rows and a plurality of columns. The pixel array 230 may generate the pixel signals PXOUT2$s$ for each row based on the row-control signals RCTRL2$s$. For example, the pixel array 230 may generate, based on the first row-control signals, the pixel signals PXOUT2$s$ from the pixels arranged in the first row ROW1 during a first row-line period and generate, based on the $y^{th}$ row-control signals, the pixel signals PXOUT2$s$ from the pixels arranged in the $y^{th}$ row ROWy during an $y^{th}$ row-line period.

Figure 8:
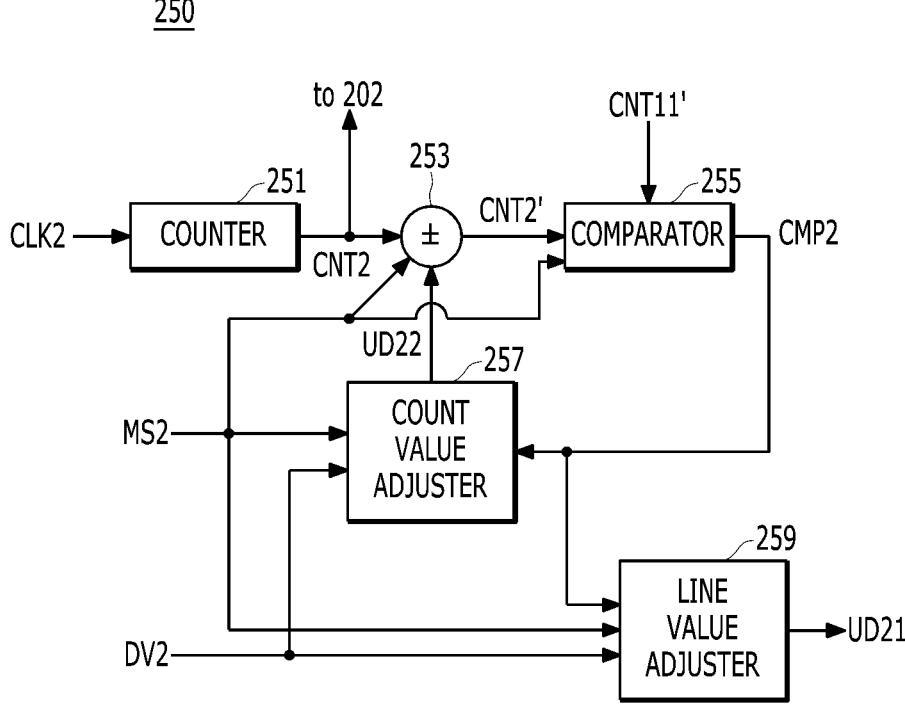
FIG. 8 is a block diagram illustrating a synchronization controller illustrated in FIG. 6.

FIG. 8 is a block diagram illustrating the synchronization controller 250 illustrated in FIG. 6. FIGS. 9 to 12 are diagrams additionally illustrating an operation of a comparator 255 illustrated in FIG. 8 in accordance with an embodiment of the present disclosure.

Referring to FIG. 8, the synchronization controller 250 may include a counter 251, a target count generator 253, a comparator 255, a count value adjuster 257, and a line value adjuster 259.

The counter 251 may count the second toggling number of the second clock signal CLK2 for each frame period. The counter 251 may generate a second toggling count signal CNT2 corresponding to a count value of the second clock signal CLK2.

Each of the target count generator 253, the comparator 255, and the count value adjuster 257 may be enabled according to the second identification signal MS2. In the present embodiment, as the second electronic device 20 is set as the slave device, the second identification signal MS2 may have a logic level indicating the slave device. When the second electronic device 20 is set as the slave device, each of the target count generator 253, the comparator 255, and the count value adjuster 257 may be designed to be enabled.

The target count generator 253 may generate a second target count signal CNT2' based on the second toggling count signal CNT2 and an adjusting signal UD22. For example, the target count generator 253 may output the second toggling count signal CNT2 as the second target count signal CNT2' or generate the second target count signal CNT2' by increasing or decreasing the second toggling count signal CNT2.

The comparator 255 may compare count values between the second target count signal CNT2' and the first reference count signal CNT11' and generate a comparison signal CMP2 corresponding to a difference value between the count value corresponding to the second target count signal CNT2' (hereinafter referred to as a "second count value" and the count value corresponding to the first reference count signal CNT11' (hereinafter referred to as a "first count value"). The difference value may be defined according to first to fourth conditions as shown in "Table 1" below.

TABLE 1

| No. | Condition | Difference Value |
|---|---|---|
| 1 | $A \geq B$ and $|A - B| < 2^{(n-1)}$ | $A - B$ |
| 2 | $A \geq B$ and $|A - B| \geq 2^{(n-1)}$ | $A - B - 2^n$ |
| 3 | $A < B$ and $|A - B| < 2^{(n-1)}$ | $A - B$ |
| 4 | $A < B$ and $|A - B| \geq 2^{(n-1)}$ | $A - B + 2^n$ |

In Table 1, "A" may refer to the first count value, and "B" may refer to the second count value.

Figure 9:
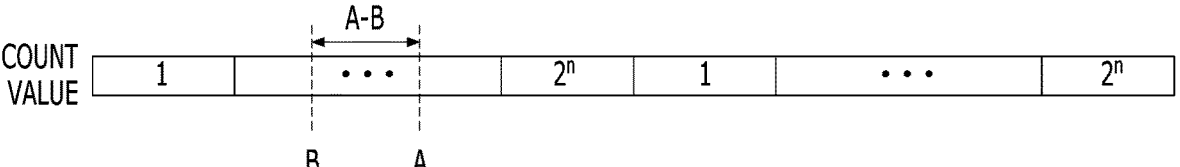
FIGS. 9 to 12 are diagrams additionally illustrating an operation of a comparator illustrated in FIG. 8 in accordance with an embodiment of the present disclosure.

In Table 1, the first condition may represent a case where the first count value A is equal to or greater than the second count value B, and an absolute value of a value (i.e., A–B) obtained by subtracting the second count value B from the first count value A is less than half $2^{(n-1)}$ of a maximum count value $2^n$ of the counter 251. The difference value according to the first condition may be equal to the value (i.e., A–B) obtained by subtracting the second count value B from the first count value A. As illustrated in FIG. 9, when the first count value A and the second count value B satisfy the first condition, it may be seen that the second count value B has to increase by the value (i.e., A–B) obtained by subtracting the second count value B from the first count value A.

Figure 10:
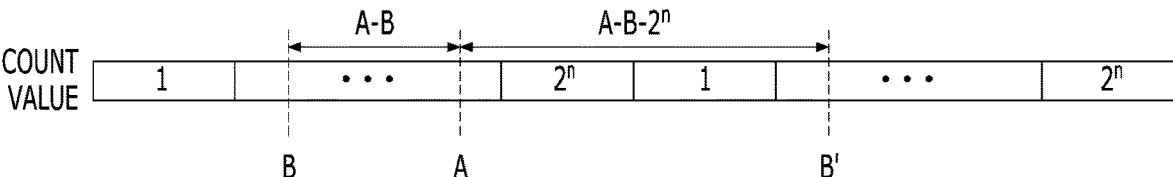

In Table 1, the second condition may represent a case where the first count value A is equal to or greater than the second count value B, and the absolute value of the value (i.e., A–B) obtained by subtracting the second count value B from the first count value A is equal to or greater than the half $2^{(n-1)}$ of the maximum count value $2^n$. The difference value according to the second condition may be equal to a value (i.e., A–(B+$2^n$)) obtained by subtracting the sum (i.e., B+$2^n$) of the second count value B and the maximum count value $2^n$ from the first count value A. As illustrated in FIG. 10, when the first count value A and the second count value B satisfy the second condition, the sum (i.e., B+$2^n$=B') of the second count value B and the maximum count value $2^n$ may be used instead of the second count value B. When the first count value A and the second count value B satisfy the second condition, it may be seen that the sum (i.e., B+$2^n$=B') has to decrease by the subtraction value (i.e., A–(B+$2^n$)).

Figure 11:
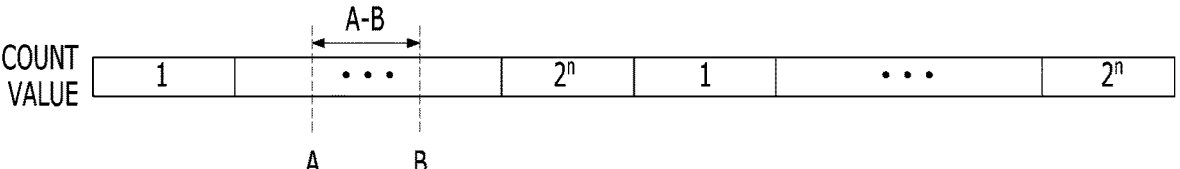

In Table 1, the third condition may represent a case where the first count value A is less than the second count value B, and the absolute value of the value (i.e., A–B) obtained by subtracting the second count value B from the first count value A is less than the half $2^{(n-1)}$ of the maximum count value $2^n$. The difference value according to the third condition may be equal to the value (i.e., A–B) obtained by subtracting the second count value B from the first count value A. As illustrated in FIG. 11, when the first count value A and the second count value B satisfy the third condition, it may be seen that the second count value B has to decrease by the value (i.e., A–B) obtained by subtracting the second count value B from the first count value A.

Figure 12:
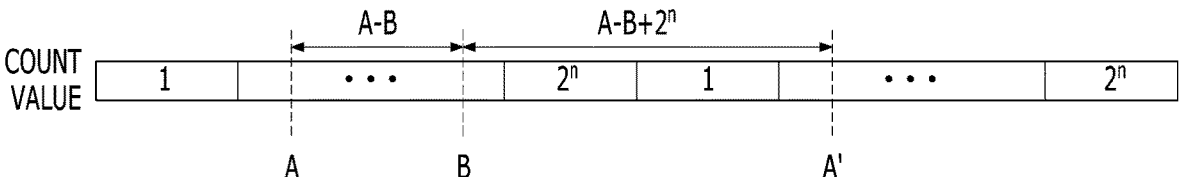

In Table 1, the fourth condition may represent a case where the first count value A is less than the second count value B, and the absolute value of the value (i.e., A–B) obtained by subtracting the second count value B from the first count value A is equal to or greater than the half $2^{(n-1)}$ of the maximum count value $2^n$. The difference value according to the fourth condition may be equal to a value (i.e., A–B+$2^n$) obtained by subtracting the second count value B from the sum (i.e., A+$2^n$) of the first count value A and the maximum count value $2^n$. As illustrated in FIG. 12, when the first count value A and the second count value B satisfy the fourth condition, the sum (i.e., A+$2^n$=A') of the first count value A and the maximum count value $2^n$ may be used instead of the first count value A. When the first count value A and the second count value B satisfy the fourth condition, it may be seen that the second count value B has to increase by the subtraction value (i.e., A–B+$2^n$).

The count value controller 257 may generate, based on the comparison signal CMP2, the second identification signal MS2, and the second setting signal DV2, the adjusting signal UD22 corresponding to a default value or the difference value. For example, the count value controller 257 may generate the adjusting signal UD22 corresponding to the default value when the difference value is less than a setting value corresponding to the second setting signal DV2, and generate the adjusting signal UD22 corresponding to the difference value when the difference value is greater than the setting value. Particularly, when the comparison signal CMP2 corresponds to the first condition or the fourth condition, the count value controller 257 may generate the adjusting signal UD22 for increasing the second count value B. When the comparison signal CMP2 corresponds to the second condition or the third condition, the count value controller 257 may generate the adjusting signal UD22 for decreasing the second count value B.

The line value adjuster 259 may generate, based on the comparison signal CMP2, the second identification signal MS2 and the second setting signal DV2, the second adjusting signal UD21 corresponding to a second default value or the difference value. For example, the line value adjuster 259 may generate the second adjusting signal UD21 corresponding to the second default value when the difference value is less than the setting value corresponding to the second setting signal DV2, and generate the second adjusting signal UD21 corresponding to the difference value when the difference value is greater than the setting value. Particularly, when the comparison signal CMP2 corresponds to the first condition or the fourth condition, the line value adjuster 259 may generate the second adjusting signal UD21 for increasing the second toggling number of the second clock signal CLK2. In addition, when the comparison signal CMP2 corresponds to the second condition or the third condition, the line value adjuster 259 may generate the second adjusting signal UD21 for decreasing the second toggling number of the second lock signal CLK2.

Figure 13:
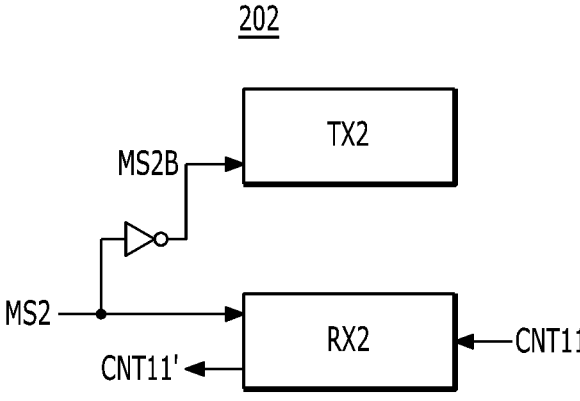
FIG. 13 is a block diagram illustrating a second interface illustrated in FIG. 1.

FIG. 13 is a block diagram illustrating the second interface 202 illustrated in FIG. 1.

Referring to FIG. 13, the second interface 202 may include a transmitter TX2 and a receiver RX2.

The transmitter TX2 may be disabled according to the second identification signal MS2. More precisely, the transmitter TX2 may be disabled according to an inverted signal MS2B of the second identification signal MS2.

The receiver RX2 may be enabled according to the second identification signal MS2. The receiver RX2 may receive the first count signal CNT11 and output the first reference count signal CNT11' corresponding to the first count signal CNT11 to the second image sensor 200.

Hereinafter, an operation of the electronic system in accordance with an embodiment of the present disclosure, which has the above-described configuration, is described with reference to FIGS. 14 and 15.

Figure 14:
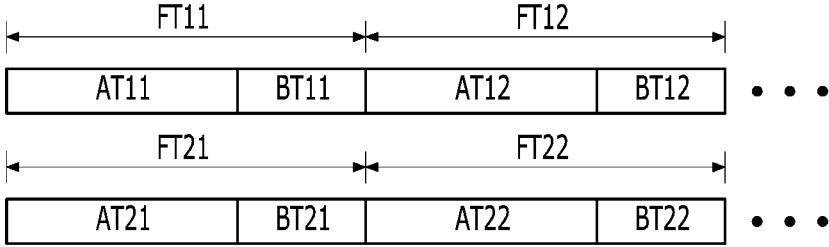
FIG. 14 is a diagram illustrating an operation of the electronic system illustrated in FIG. 1.

FIG. 14 is a diagram illustrating an operation of the electronic system illustrated in FIG. 1.

Referring to FIG. 14, the first electronic device 10 and the second electronic device 20 may be synchronized when recording a video. For example, the first electronic device 10 may obtain a plurality of first image frames during a plurality of first frame periods FT11, FT12, . . . , and the second electronic device 20 may obtain a plurality of second image frames during a plurality of second frame periods FT21, FT22, . . . . The plurality of first image frames and the plurality of second image frames may be synchronized.

The plurality of first frame periods FT11, FT12, . . . may include a plurality of first active periods AT11, AT12, . . . and a plurality of first blank periods BT11, BT12, . . . . Each of the plurality of first active periods AT11, AT12, . . . may include a plurality of first row-line periods corresponding to the first to $y^{th}$ rows ROW1 to ROWy of the first pixel array 130 included in the first image sensor 100. Each of the plurality of first blank periods BT11, BT12, . . . may include a period between a current first active period, for example, AT11, and a next first active period, for example, AT12. Each of the plurality of first blank periods BT11, BT12, . . . may include a plurality of first dummy row-line periods.

The plurality of second frame periods FT21, FT22, . . . may include a plurality of second active periods AT21, AT22, . . . and a plurality of second blank periods BT21, BT22, . . . . Each of the plurality of second active periods AT21, AT22, . . . may include a plurality of second row-line periods corresponding to the first to y$^{th}$ rows ROW1 to ROWy of the second pixel array 230 included in the second image sensor 200. Each of the plurality of second blank periods BT21, BT22, . . . may include a period between a current second active period, for example, AT21, and a next second active period, for example, AT22. Each of the plurality of second blank periods BT21, BT22, . . . may include a plurality of second dummy row-line periods.

The first electronic device 10 may transmit, to the second electronic device 20, the first count signal CNT11 generated by the first image sensor 100. The first count signal CNT11 may correspond to the first count value A obtained by counting the first toggling number of the first clock signal CLK1 during the plurality of first frame periods FT11, FT12, . . . .

The first count signal CNT11 may be transmitted from the first electronic device 10 to the second electronic device 20 through a wireless communication network, for example, a Wi-Fi network.

The second electronic device 20 may receive the first count signal CNT11 as the first reference count signal CNT11'. The second electronic device 20 may compare the count values between the first reference count signal CNT11' and the second target count signal CNT2', which is generated by the second image sensor 200. The second target count signal CNT2' may correspond to the second count value B obtained by counting the second toggling number of the second clock signal CLK2 during the plurality of second frame periods FT21, FT22, . . . .

When a result of comparing the count values between the first reference count signal CNT11' and the second target count signal CNT2' indicates that the first count value A corresponding to the first reference count signal CNT11' is different from the second count value B corresponding to the second target count signal CNT2', the second electronic device 20 may adjust some of the plurality of second frame periods FT21, FT22, . . . of the second image sensor 200. For example, the second electronic device 20 may adjust some of the plurality of second blank periods BT21, BT22, . . . . The second electronic device 20 may adjust the some of the plurality of second frame periods FT21, FT22, . . . until the first count value A becomes equal to the second count value B. When the first count value A becomes equal to the second count value B, the second electronic device 20 may return, to their original frame periods, periods following after the some of the plurality of second frame periods FT21, FT22, . . . . That is, the second electronic device 20 may return, to default frame periods, the periods following after the some of the plurality of second frame periods FT21, FT22, . . . .

When the second electronic device 20 adjusts the some of the plurality of second frame periods FT21, FT22, . . . of the second image sensor 200, the first electronic device 10 may maintain the plurality of first frame periods of the first image sensor 100 constant, and accordingly, the plurality of second image frames may be synchronized with the plurality of first image frames.

Figure 15:
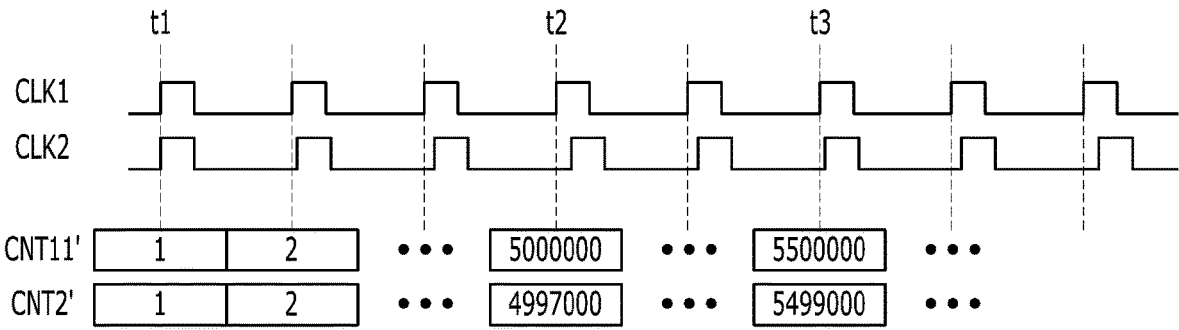
FIG. 15 is a diagram additionally illustrating an operation of the electronic system illustrated in FIG. 10 in accordance with an embodiment of the present disclosure.

FIG. 15 is a diagram additionally illustrating an operation of the electronic system illustrated in FIG. 10 in accordance with an embodiment of the present disclosure.

Referring to FIG. 15, the second electronic device 20 may adjust the plurality of second frame periods FT21, FT22, . . . by increasing or decreasing the second toggling number of the second clock signal CLK2. Since the second toggling number may correspond to the plurality of second dummy row-line periods, and since the plurality of second dummy row-line periods may correspond to the respective second blank periods BT21, BT22, . . . , the second electronic device 20 may adjust the plurality of second frame periods FT21, FT22, . . . by increasing or decreasing the second toggling number. A more detailed description thereof is as follows.

The first electronic device 10 and the second electronic device 20 may synchronize, with each other, the count value of the first reference count signal CNT11' and the count value of the second target count signal CNT2' at a start point of time "t1" of video recording. For example, the second electronic device 20 may use the count value of the first reference count signal CNT11' as the count value of the second target count signal CNT2' at the start point of time "t1".

Although it is described as an example in the present embodiment that the count value of the first reference count signal CNT11' and the count value of the second target count signal CNT2' at the start point of time "t1" are "1", the present disclosure is not limited thereto, and the count value of the first reference count signal CNT11' and the count value of the second target count signal CNT2' at the start point of time "t1" may be set in consideration of at least one of various factors. The various factors may include a network delay time of the wireless communication network and a difference in performance, for example, processing capability, etc., between the first and second electronic devices 10 and 20.

At a detection point of time "t2" after a predetermined time elapses from the start point of time "t1" during video recording, the first electronic device 10 may transmit the first count signal CNT11 to the second electronic device 20. The second electronic device 20 may receive the first count signal CNT11 as the first reference count signal CNT11' and compare the first count value A corresponding to the first reference count signal CNT11' with the second count value B corresponding to the second target count signal CNT2'. The second electronic device 20 may increase or decrease the second target count signal CNT2' (refer to Table 1) and adjust the second toggling number of the clock signal CLK2, based on a difference value between the first count value A and the second count value B. The second electronic device 20 may adjust the plurality of second dummy row-line periods by adjusting the second toggling number of the second clock signal CLK2. For example, the second electronic device 20 may constantly divide and adjust a toggling number of the second target count signal CNT2' during a plurality of frame periods, and accordingly, the second count value B of the second target count signal CNT2' may converge on the first count value A of the first reference count signal CNT11'.

At an end point of time "t3" at which the first count value A becomes equal to the second count value B as the second count value B converges on the first count value A, the second electronic device 20 may return the second toggling number of the second clock signal CLK2 to its original toggling number.

According to an embodiment of the present disclosure, image frames can be synchronized using a count value corresponding to a toggling number of a clock signal when recording a video.

According to an embodiment of the present disclosure, image frames can be easily synchronized without accessing an external device, for example, a network server.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. An electronic device comprising:
a counter suitable for counting a clock signal and generating a count signal corresponding to a count value of the clock signal;
a target count generator suitable for generating a target count signal based on the count signal and a second adjusting signal;
a comparator suitable for comparing the target count signal with a reference count signal and generating a comparison signal which corresponds to a difference value between the count value corresponding to the target count signal and a count value corresponding to the reference count signal; and
a count value adjuster suitable for generating the second adjusting signal corresponding to the difference value, based on the comparison signal.

2. The electronic device of claim 1, further comprising:
a line value adjuster suitable for generating a first adjusting signal corresponding to the difference value, based on the comparison signal; and
a clock generator suitable for generating the clock signal for each predetermined period and adjusting a toggling number of the clock signal, based on the first adjusting signal.

3. The electronic device of claim 1, further comprising an interface suitable for receiving the reference count signal from an external device.

4. The electronic device of claim 1, further comprising:
a row-controller suitable for generating row-control signals for each predetermined period, based on the clock signal;
a pixel array suitable for generating pixel signals for each predetermined period, based on the row-control signals; and
a signal converter suitable for converting the pixel signals into digital signals.

5. An electronic system comprising:
a first electronic device suitable for obtaining first image frames for each frame period, based on a first clock signal and generating a first count signal corresponding to the first clock signal; and
a second electronic device suitable for obtaining second image frames for each frame period, based on a second clock signal, and adjusting a toggling number of the second clock signal for each frame period, based on the first count signal and the second clock signal, wherein the first electronic device includes:
a first clock generator suitable for generating the first clock signal having a predetermined toggling number for each frame period, based on a first adjusting signal;
a first row-controller suitable for generating first row-control signals for each frame period, based on the first clock signal;
a first pixel array suitable for generating first pixel signals for each frame period, based on the first row-control signals;
a first signal converter suitable for converting the first pixel signals into first digital signals; and
a first synchronization controller suitable for generating the first adjusting signal and the first count signal, based on the first clock signal, a first identification signal and a first setting signal.

6. The electronic system of claim 5, wherein a cycle of the first clock signal is equal to a cycle of the second clock signal.

7. The electronic system of claim 5, wherein the first electronic device includes:
a first image sensor including the first clock generator, the first row-controller, the first pixel array, the first signal converter, and the first synchronization controller suitable for obtaining the first image frames, based on the first clock signal, and counting a toggling number of the first clock signal to generate a first toggling count signal; and
a first interface suitable for receiving the first toggling count signal and outputting the first count signal.

8. The electronic system of claim 5, wherein the first synchronization controller includes:
a first counter suitable for counting the first clock signal and generating the first count signal corresponding to a first count value of the first clock signal;
a first target count generator disabled according to the first identification signal;
a first comparator disabled according to the first identification signal;
a first count value adjuster disabled according to the first identification signal; and
a first line value adjuster suitable for generating the first adjusting signal corresponding to a first default value, based on the first identification signal and the first setting signal.

9. The electronic system of claim 7, wherein the first interface includes:
a first transmitter enabled according to a first identification signal and suitable for transmitting the first count signal to the second image sensor; and
a receiver disabled according to the first identification signal.

10. The electronic system of claim 5, wherein the second electronic device includes:
a second image sensor suitable for obtaining the second image frames, based on the second clock signal, and adjusting the toggling number of the second clock signal, based on a first reference count signal and the second clock signal; and
a second interface suitable for receiving the first count signal and outputting the first reference count signal.

11. The electronic system of claim 10, wherein the second image sensor includes:
a second clock generator suitable for generating the second clock signal for each frame period and adjusting the toggling number of the second clock signal, based on a third adjusting signal;

a second row-controller suitable for generating second row-control signals for each frame period, based on the second clock signal;

a second pixel array suitable for generating second pixel signals for each frame period, based on the second row-control signals;

a second signal converter suitable for converting the second pixel signals into second digital signals; and a second synchronization controller suitable for generating the third adjusting signal and a second count signal, based on the first count signal, the second clock signal, a second identification signal and a second setting signal.

12. The electronic system of claim 11, wherein the second synchronization controller includes:

a second counter suitable for counting the second clock signal and generating the second count signal corresponding to a second count value of the second clock signal;

a second target count generator enabled according to the second identification signal and suitable for generating a second target count signal, based on the second count signal and a fourth adjusting signal;

a second comparator enabled according to the second identification signal and suitable for comparing the second target count signal with the first count signal and generating a comparison signal corresponding to a difference value between the second count value corresponding to the second target count signal and a first count value corresponding to the first count signal;

a second count value adjuster enabled according to the second identification signal and suitable for generating the fourth adjusting signal corresponding to the difference value, based on the comparison signal; and a second line value adjuster suitable for generating the third adjusting signal corresponding to the difference value, based on the second identification signal, the second setting signal and the comparison signal.

13. The electronic system of claim 10, wherein the second interface includes:

a second transmitter disabled according to a second identification signal; and a second receiver enabled according to the second identification signal and suitable for receiving the first count signal from the first image sensor.

14. The electronic system of claim 5, wherein the first count signal is transmitted from the first electronic device to the second electronic device through a wireless communication network.

15. The electronic system of claim 14, wherein the wireless communication network includes a Wi-Fi network.

16. An operating method of an electronic system, comprising:

providing, by a first electronic device, a second electronic device with a first count signal generated by a first image sensor;

comparing, by the second electronic device, the first count signal with a second count signal generated by a second image sensor; and adjusting, by the second image sensor, a second frame period of the second image sensor while maintaining, by the first image sensor, a first frame period when, as a result of the comparing, a first count value corresponding to the first count signal is different from a second count value corresponding to the second count signal.

17. The operating method of claim 16, wherein the adjusting is performed until the first count signal becomes equal to the second count signal.

18. The operating method of claim 17, wherein the adjusting includes returning the second frame period to its original frame period when the first count signal becomes equal to the second count signal.

19. The operating method of claim 16, wherein:

the second frame period includes an active period and a blank period, the active period includes a plurality of row-line periods corresponding to a plurality of rows of a second pixel array included in the second image sensor, the blank period is between a current active period and a next active period, and the adjusting includes adjusting the blank period.

* * * * *